(12) United States Patent
Hornkamp

(10) Patent No.: US 8,238,108 B2
(45) Date of Patent: Aug. 7, 2012

(54) POWER SEMICONDUCTOR MODULE SYSTEM

(75) Inventor: Michael Hornkamp, Ense (DE)

(73) Assignee: Infineon Technologies AG, Neubiberg (DE)

( * ) Notice: Subject to any disclaimer, the term of this patent is extended or adjusted under 35 U.S.C. 154(b) by 594 days.

(21) Appl. No.: 12/397,901

(22) Filed: Mar. 4, 2009

(65) Prior Publication Data

US 2010/0165582 A1 Jul. 1, 2010

(30) Foreign Application Priority Data

Mar. 4, 2008 (DE) .................. 10 2008 012 570

(51) Int. Cl.
*H05K 1/14* (2006.01)
(52) U.S. Cl. ........ 361/747; 361/732; 361/759; 257/678; 257/683; 257/731; 257/732
(58) Field of Classification Search .................. 361/747
See application file for complete search history.

(56) References Cited

U.S. PATENT DOCUMENTS

| | | | |
|---|---|---|---|
| 5,515,240 A * | 5/1996 | Rodeffer et al. .............. | 361/759 |
| 5,625,536 A | 4/1997 | Soyano et al. | |
| 5,642,265 A * | 6/1997 | Bond et al. ................... | 361/809 |
| 5,791,914 A * | 8/1998 | Loranger et al. ................ | 439/71 |
| 6,111,760 A * | 8/2000 | Nixon ........................... | 361/814 |
| 6,137,680 A * | 10/2000 | Kodaira et al. ................ | 361/697 |
| 6,301,096 B1 * | 10/2001 | Wozniczka .................... | 361/674 |
| 6,396,702 B1 * | 5/2002 | Boucheron et al. ........... | 361/752 |
| 6,504,724 B2 * | 1/2003 | Serizawa et al. ............. | 361/752 |
| 6,738,258 B2 * | 5/2004 | Bijlenga et al. .............. | 361/704 |
| 6,894,891 B2 * | 5/2005 | Darr et al. ..................... | 361/601 |
| 6,903,941 B2 * | 6/2005 | Paola ............................ | 361/803 |
| 6,956,746 B2 * | 10/2005 | Barsun et al. ................. | 361/785 |
| 7,984,540 B2 * | 7/2011 | Blakeway ........................ | 29/428 |
| 2004/0022029 A1 * | 2/2004 | Nagatomo et al. ........... | 361/709 |
| 2005/0167806 A1 * | 8/2005 | Mullen et al. ................ | 257/678 |
| 2005/0174748 A1 * | 8/2005 | Kojima ......................... | 361/796 |
| 2006/0023431 A1 * | 2/2006 | Wetzel ........................... | 361/739 |
| 2008/0054442 A1 * | 3/2008 | Kanschat et al. ............ | 257/696 |
| 2009/0251850 A1 * | 10/2009 | Morales et al. .............. | 361/622 |

FOREIGN PATENT DOCUMENTS

DE 10 2005 039 946 3/2007

* cited by examiner

*Primary Examiner* — Anthony Q Edwards
(74) *Attorney, Agent, or Firm* — Dicke, Billig & Czaja, PLLC

(57) ABSTRACT

A power semiconductor module system. One embodiment provides a power semiconductor module and a mounting adapter. The mounting adapter and the power semiconductor module can be latched to one another in two different latching stages such that a contact element of the power semiconductor module makes electrical contact with a contact element of the mounting adapter assigned to the contact element in a second one of the latching stages but not in a first one of the latching stages.

25 Claims, 12 Drawing Sheets

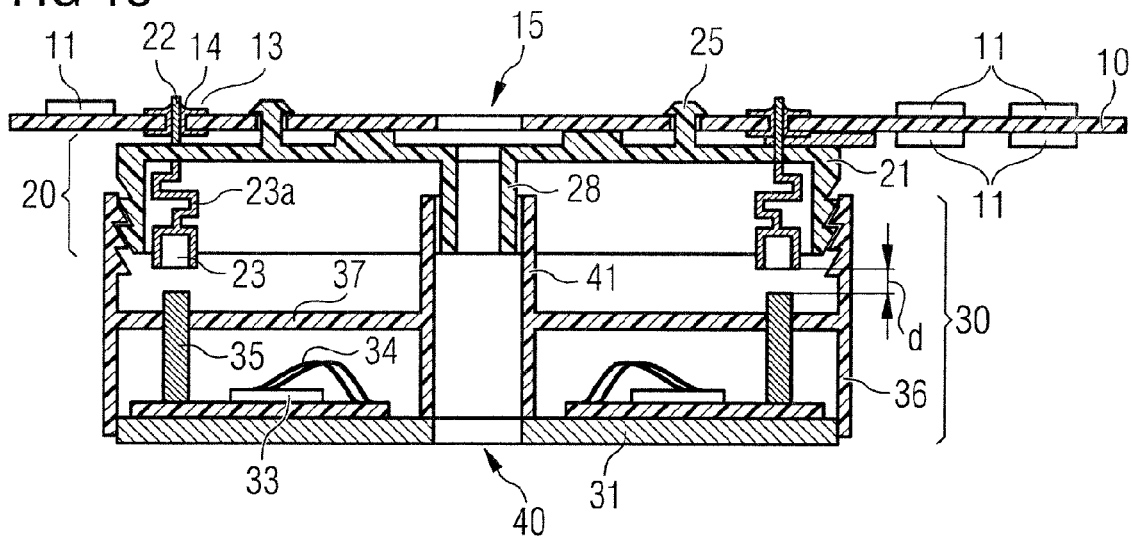
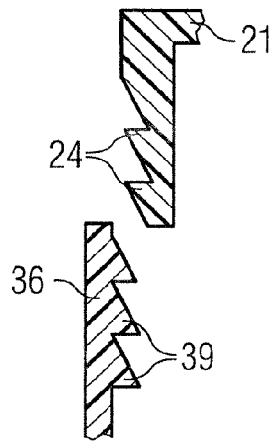
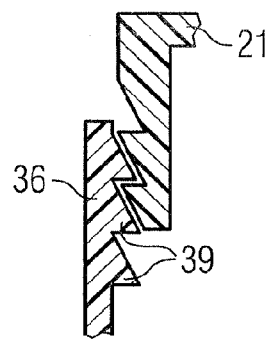
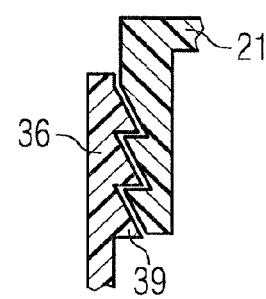
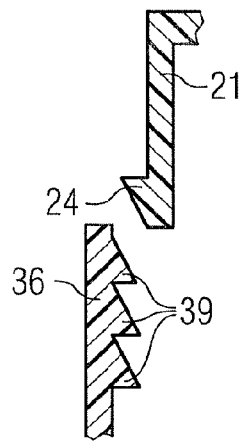
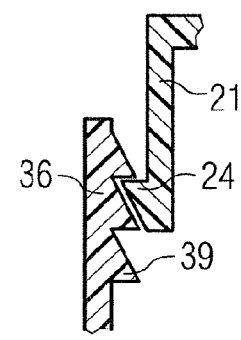
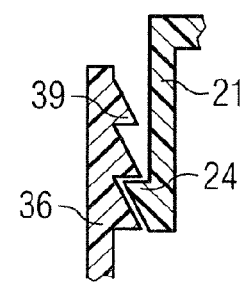
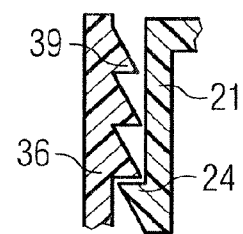

POWER SEMICONDUCTOR MODULE SYSTEM

CROSS-REFERENCE TO RELATED APPLICATIONS

This Utility Patent Application claims priority to German Patent Application No. DE 10 2008 012 570.9-33 filed on Mar. 4, 2008, which is incorporated herein by reference.

BACKGROUND

The invention relates to a power semiconductor module system. Power semiconductor modules such as are used, for example, in converters, high-voltage direct-current transmission installations, in the electrical supply of motors or the like have external terminals soldered to other electrical components, for example, to a circuit carrier that can be equipped with driving electronics for the power semiconductor module. In comparison with the electrical terminals of conventional electronic components such as are used, for example, for such driving electronics, the electrical terminals of the power semiconductor module are thermally coupled with high heat capacities. These high heat capacities may be based e.g., on a solid metallic baseplate of the power semiconductor module and/or on a heat buffer thermally coupled to a semiconductor chip of the module.

As a result of the thermal coupling of the electrical terminals to be soldered with elements having a high heat capacity, problems can arise if such a power semiconductor module and also conventional electronic components are intended to be soldered onto a circuit carrier simultaneously, that is to say in the same soldering step. The comparatively high heat capacity with which the terminals of the power semiconductor module are thermally coupled draws the heat supplied during the soldering operation from the terminals. The soldering operation requires a comparatively long time since the heat supplied to the soldering location during soldering initially dissipates rapidly, such that the temperature increases significantly more slowly at the soldering locations of the terminals of the power semiconductor module than at the terminals of the conventional electronic components which are likewise to be soldered to the circuit carrier.

Since a soldering at an excessively low temperature can lead to dry soldered joints and thus to a failure of the power semiconductor module, care must be taken to ensure that the soldering of the terminals of the power semiconductor module onto the circuit carrier is effected at a predetermined minimum soldering temperature. However, a process time for the soldering operation that is accordingly chosen to be long enough for the soldering of the terminals of the power semiconductor module can have the effect that the conventional electronic components are overheated and thereby destroyed or at least damaged during the soldering operation.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 13 illustrates one embodiment of a power semiconductor module arrangement wherein the terminal locations of the mounting adapter are embodied as pins which are inserted into contact holes of a circuit carrier and are soldered to the contact holes.

FIG. 14 illustrates various latching stages of a latching of latching elements of a mounting adapter to latching elements of a power semiconductor module.

FIG. 15 illustrates various latching stages of a latching of latching elements of a mounting adapter to latching elements of a power semiconductor module, wherein the latching elements of the power semiconductor module are embodied as multiple latching lugs and the corresponding latching elements of the mounting adapter are embodied as single latching lugs.

DETAILED DESCRIPTION

Figure 1A:
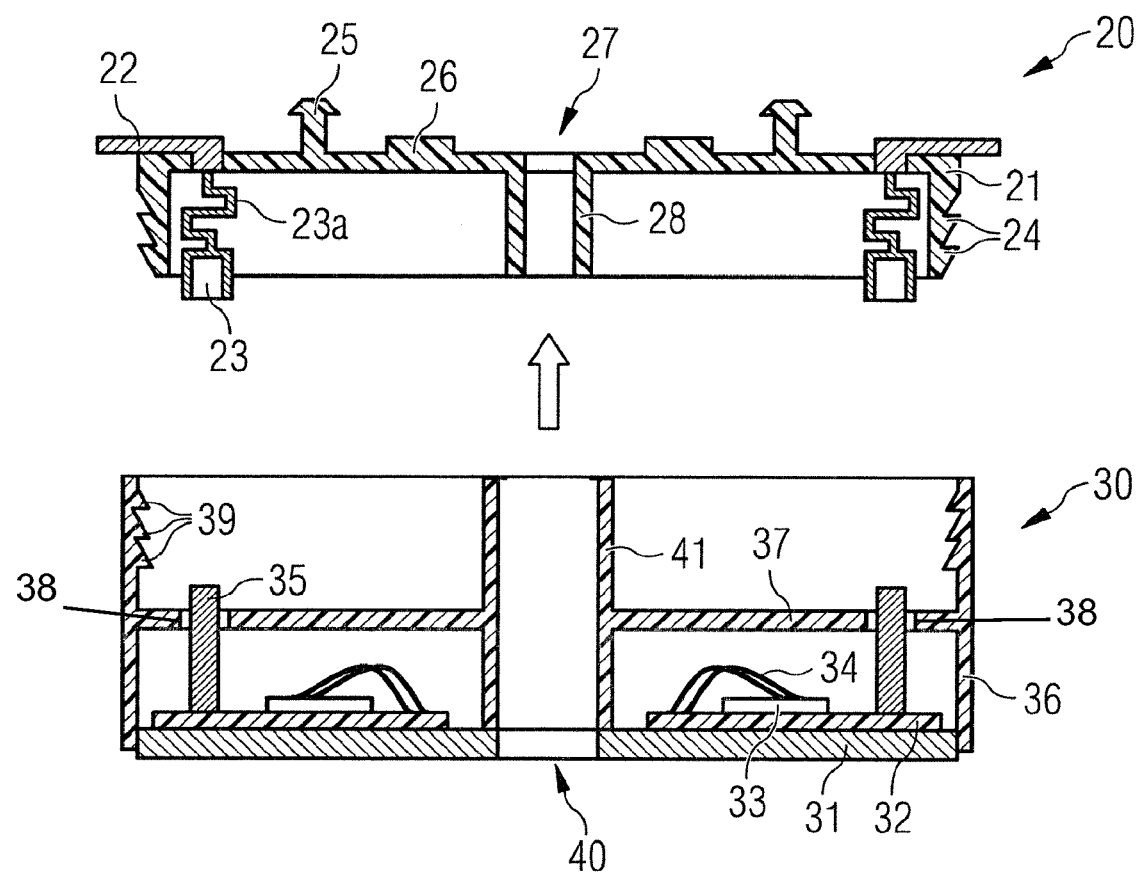
FIGS. 1A-1E illustrate a method for producing a power semiconductor module arrangement, wherein a mounting adapter that can be latched to a power semiconductor module in two latching stages is soldered onto a circuit carrier together with further electronic components in a first latching stage and the power semiconductor module is subsequently latched to the mounting adapter in a second latching stage.

In the following Detailed Description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In one embodiment, a power semiconductor module system is provided including a mounting adapter for producing electrically conductive connections between a circuit carrier and a power semiconductor module. The mounting adapter has electrically conductive contact elements serving for the electrical contact-connection of a power semiconductor module. Each of the contact elements is electrically conductively connected to a solderable terminal location of the mounting adapter.

In one embodiment, the system includes a power semiconductor module having electrically conductive contact elements which can in each case be electrically contact-connected to an assigned contact element of the mounting adapter. The mounting adapter and the power semiconductor module can be latched to one another in two different latching stages such that at least one of the contact elements of the power semiconductor module makes electrical contact with that contact element of the mounting adapter which is assigned to the contact element in a second one of the latching stages but not in a first one of the latching stages.

As long as the terminal locations of such a mounting adapter are not thermally coupled with the comparatively high heat capacities of the power semiconductor module via a low heat transfer resistance, they can be reliably soldered to a circuit carrier together with electrical terminals of conventional electronic components during the same soldering step. An electrically conductive connection between the contact element of the power semiconductor module and that contact element of the mounting adapter which is assigned to the contact element can then be effected after the conclusion of the soldering operation, that is to say that during the soldering operation the terminal of the mounting adapter that is to be soldered is thermally decoupled from the particularly high heat capacities. A coupling is effected only after the completion of the soldering connection.

As a result of this thermal decoupling, the soldering terminals of the mounting adapter that are subsequently to be contact-connected to the power semiconductor module and the soldering terminals of conventional electronic components can be soldered to a circuit carrier in the same soldering process without there being the risk of "dry soldered joints" or of overheating of the conventional electronic components.

FIGS. 1A-1E illustrate one embodiment of a method for producing a power semiconductor module arrangement including a power semiconductor module system. The power semiconductor module system includes a power semiconductor module 30 and a mounting adapter 20 in accordance with FIG. 1A. The power semiconductor module 30 has a dielectric housing 36 with a cover plate 37 and a cylindrical supporting element 41. A central fixing opening 40 enclosed by the cylindrical supporting element 41 serves for the mounting of the power semiconductor module 30. The cylindrical supporting element 41 serves to avoid flexure of the power semiconductor module when the latter is screwed to a heat sink. In addition, it seals off the interior of the housing from the central fixing opening 40, such that the potting compound used during later potting of the interior cannot escape.

The housing 36 can be produced by using injection-molding technology, for example. A metallic baseplate 31, for example, composed of copper or aluminum, terminates the power semiconductor module 30 toward the bottom. The substrates 32 each carrying one or more power semiconductor chips 33 are arranged on the baseplate 31. The substrates 32 have, at least on their top side remote from the baseplate 31, a structured metalization (not illustrated in FIG. 1A) which is connected to specific terminal contacts of the relevant power semiconductor chips 33 in one embodiment by using a solder or by using an electrically conductive adhesive.

An electrically conductive contact element 35, for example, a metallic strap, is conductively connected to the structured metalization of the substrate 32 at its lower end. The contact elements 35 project from openings 38 in the cover plate 37, such that the upper ends of the contact elements 35 are accessible from the exterior side of the housing 36 and are therefore available for contact-connection to components external to the module. The side wall of the housing 36 has, at its end remote from the baseplate 31, latching elements 39 which are embodied as latching lugs, for example, and are provided for latching the power semiconductor module 30 to the mounting adapter 20.

The mounting adapter 20 includes a dielectric body 21, into which terminal locations 22 are inserted or injected. For soldering to the corresponding terminal locations 13 of the circuit carrier 10, the terminal locations 22 can each have a plane cut portion and be embodied, for example, as SMD contact areas (SMD="Surface Mounted Device"). The mounting adapter 20 furthermore has contact elements 23 which are in each case electrically conductively connected to one of the terminal locations 22. The ends of the contact elements 23 are embodied in sleeve-type fashion and are in each case connected to the corresponding terminal locations 22 by using a resilient section 23a.

Optional latching elements 25 and optional supporting elements 26 are integrally formed onto the body 21, onto that side of the dielectric body 21 on which the terminal locations 22 are arranged. The dielectric body 21 can be produced by using an injection-molding method, for example. In this case, the latching elements 25 and/or the supporting elements 26 can be produced integrally with the body 21. The latching elements 25 are provided for latching the mounting adapter 20, by insertion of the latching elements 25 into corresponding, optional openings 12 in a component external to the module, for example, a circuit carrier 10 (see FIG. 1B) to the latter and thereby ensuring an accurately fitting alignment of the terminal locations 22 of the mounting adapter 20 with corresponding terminal locations 13 of the component external to the module.

Furthermore, the dielectric body 21 includes a cylindrical section 28 enclosing an opening 27 aligned with an optional opening 15 of the circuit carrier 10 if the terminal locations 22 are aligned with the corresponding terminal locations 13 of the circuit carrier 10 in an accurately fitting manner.

The dielectric body 21 furthermore has a number of latching elements 24 embodied as latching lugs, by way of example. The latching elements 24, which can be arranged on the outer side of the side walls of the body 21, serve for latching the mounting adapter 20 to the power semiconductor module 30. The latching elements 24, in the same way as the latching elements 25 and/or the supporting elements 26, can be integrally formed onto the dielectric body 21 by using an injection-molding method.

A description is given below, with reference to FIGS. 1A to 1E, of a method for producing a power semiconductor module arrangement including a circuit carrier 10 and also including a power semiconductor module system including a power semiconductor module 30 and also a mounting adapter 20. In accordance with FIG. 1A a power semiconductor module 30 and a mounting adapter 20 are provided. The power semiconductor module 30 is then placed onto the mounting adapter 20, such that the latching elements 39 of the power semiconductor module 30 latch with the latching elements 24 of the mounting adapter 20 in a first latching stage.

Figure 1B:
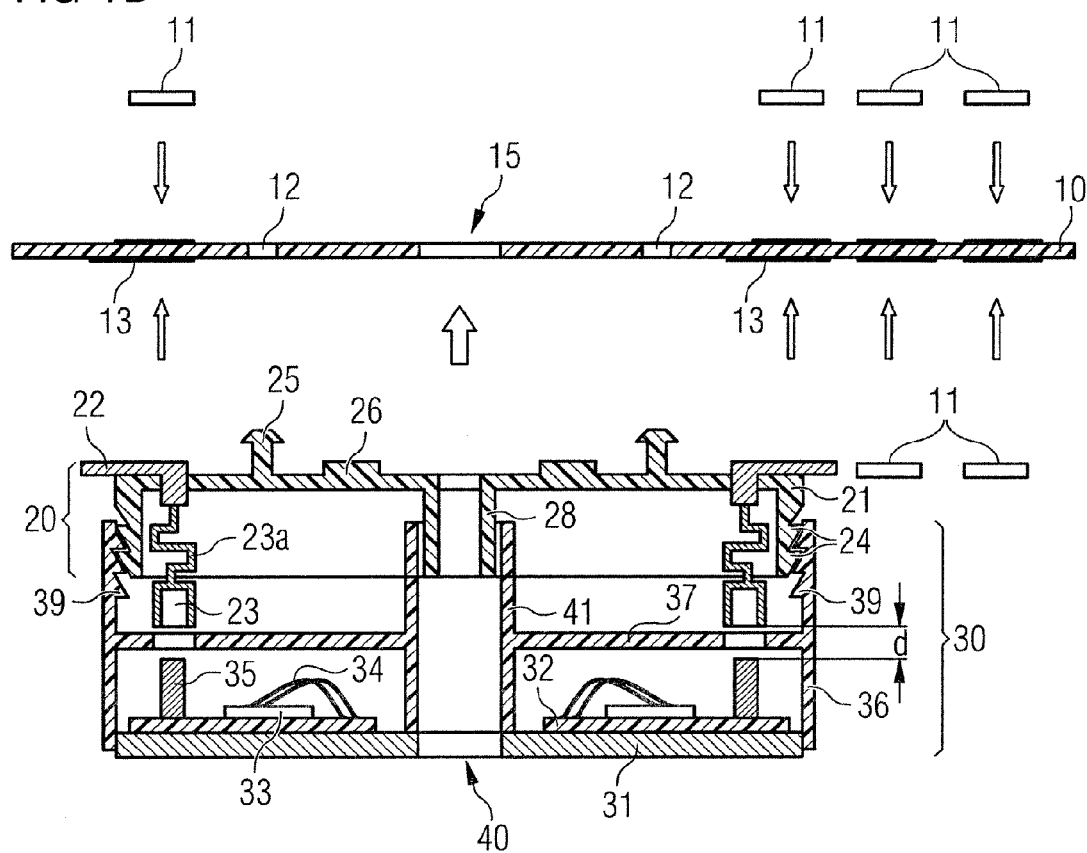

When the power semiconductor module 30 is placed onto the mounting adapter 20, two or more latching stages can be set. In the first latching stage, as illustrated in FIG. 1B, although the power semiconductor module 30 is latched with the mounting adapter 20, there is still no contact between at least one of the contact elements 35 of the power semiconductor module 30 and the respectively corresponding contact element 23 of the mounting adapter 20. As is likewise evident from FIG. 1B, provision is additionally made of a component 10 external to the module, here, for example, a circuit carrier, and optional, conventional electronic components 11, which are intended to be soldered together with the latched unit composed of the power semiconductor module 30 and the mounting adapter 20 onto the circuit carrier 10, for example, using SMD technology.

The circuit carrier 10, which can be a printed circuit board (PCB), for example, has on at least one side terminal locations 13 provided for producing soldering connections to in each case a corresponding terminal location 22 of the mounting adapter 20. The terminal locations 13 can be, for example, sections of a structured metalization of the circuit carrier 10.

The circuit carrier 10 can be populated with the mounting adapter 20 latched to the power semiconductor module 30 and also with the conventional electronic components 11 in such a way that firstly a solder paste is applied to the terminal locations 13 of the circuit carrier 10. The latching lugs 25 of the mounting adapter 20 are subsequently inserted into the corresponding openings 12 of the circuit carrier 10. The relative arrangement of the latching lugs 25 with respect to one another and correspondingly thereto of the openings 12 with respect to one another can be chosen such that the mounting adapter 20 can latch with the circuit carrier 10 only in precisely one relative position in which the terminal locations 22 bear respectively on a section of the solder paste which has been applied to that terminal location 13 of the circuit carrier which corresponds to the relevant terminal location 22.

Furthermore, the conventional electrical components 11 are placed, for example, by using a pick-and-place method, onto the predetermined metalization sections 13 provided with solder paste. After, the solder paste can be melted in a soldering furnace by the supply of heat and can subsequently be cooled again, resulting in the formation of stable soldering connections between the terminal locations 22 of the mounting adapter 20 and the conventional electronic components 11, on the one hand, and the associated terminal locations 13 of the circuit carrier 10, on the other hand. Since the contact elements 35 of the power semiconductor module 30 are still not in thermal contact with the corresponding contact elements 23 of the mounting adapter during the soldering operation performed in the first latching stage, no heat flow can occur from the terminal locations 22 of the mounting adapter 20 via the contact elements 23 toward the power semiconductor module 30. Consequently, the unit composed of mounting adapter 20 and power semiconductor module 30, in this first latching stage, can be soldered unproblematically together with the conventional electronic components 11, in accordance with the method explained with reference to FIG. 1, and to the associated sections 13 of the structured metalization of the circuit carrier 10 without there being the risk of dry soldered joints or of overheating of the conventional electronic components 11.

Figure 1C:
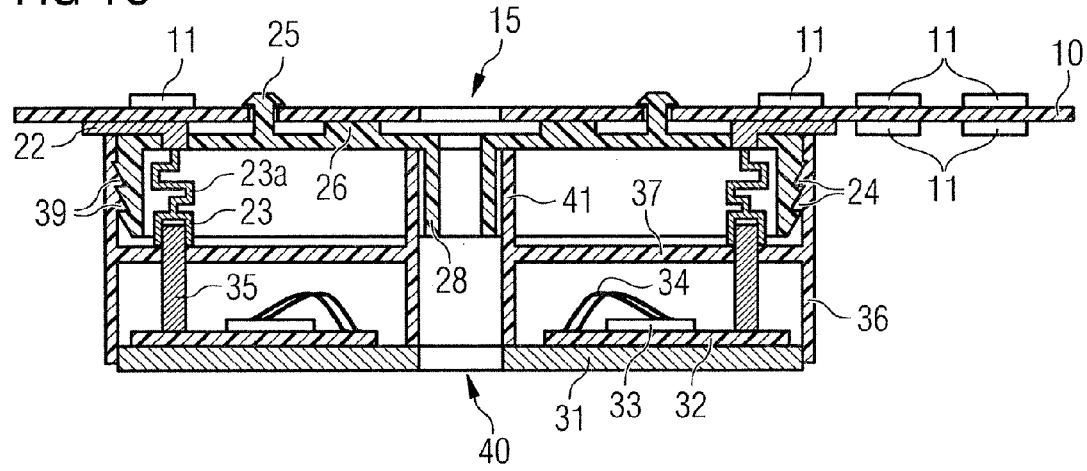

After the conclusion of the soldering operation, the power semiconductor module 30 is pushed onto the mounting adapter 20 right into a second latching stage, in which the contact elements 35 of the power semiconductor module 30 engage into the contact elements 23 of the mounting adapter 20 and make electrical contact with them, as is illustrated in FIG. 1C. This gives rise to an electrically conductive connection between the terminal locations 22 and the corresponding contact elements 35. At least one connection of this type is designed for a rated current of greater than 8 A. With the use of standard PCBs as circuit carrier 10, e.g., composed of FR4 (glass-fiber fabric and epoxy resin), the currents can be up to 200 A, and even more in special solutions.

Figure 1D:
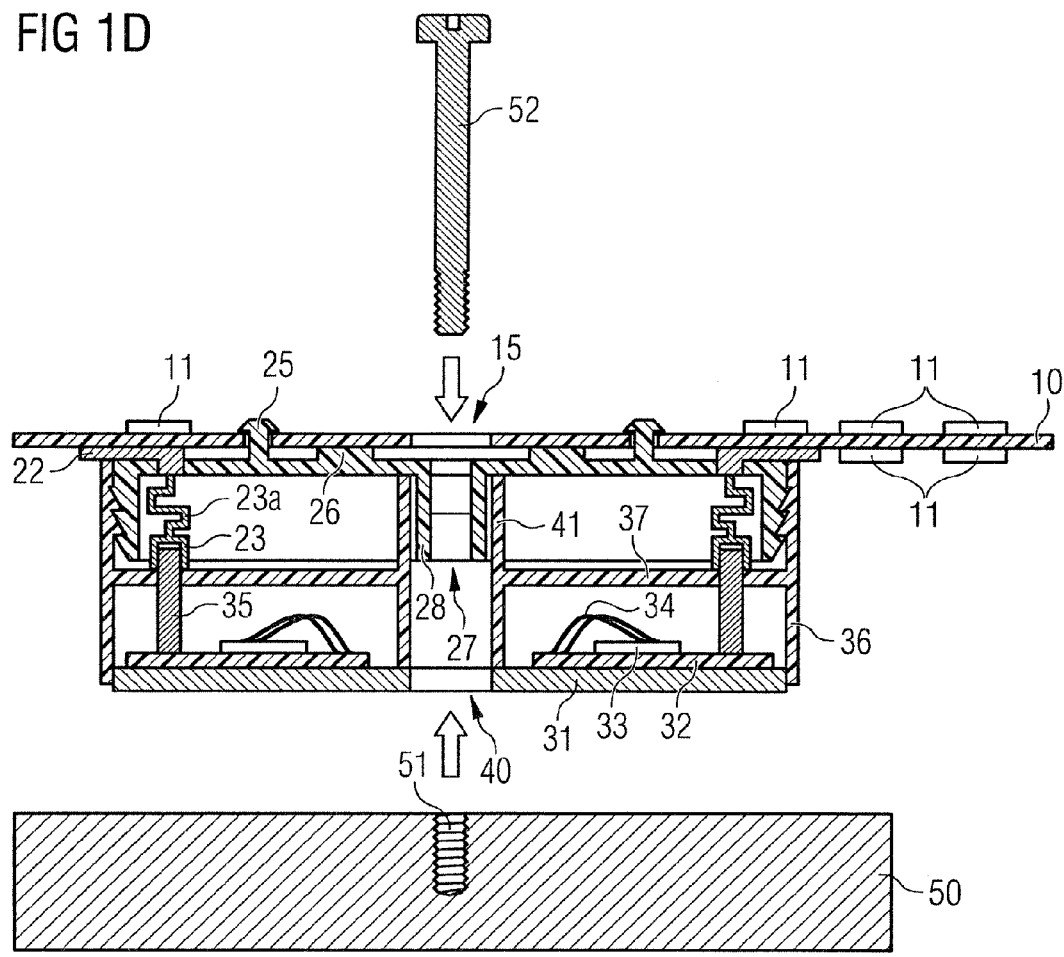

As can be seen from FIG. 1D, a screw 52 can be inserted into the aligned openings 15, 27 and 40 and be screwed into a threaded hole 51 in a heat sink 50. The baseplate 31 is thereby pressed against the heat sink 50, such that the heat arising in the power semiconductor chips 33 can be dissipated toward the heat sink 50 via the substrates 32, and the baseplate 31 of the power semiconductor module 30. In order to further improve the heat transfer, a thermally conductive paste or a thermally conductive film can be introduced between the baseplate 31 and the heat sink 50.

Figure 1E:
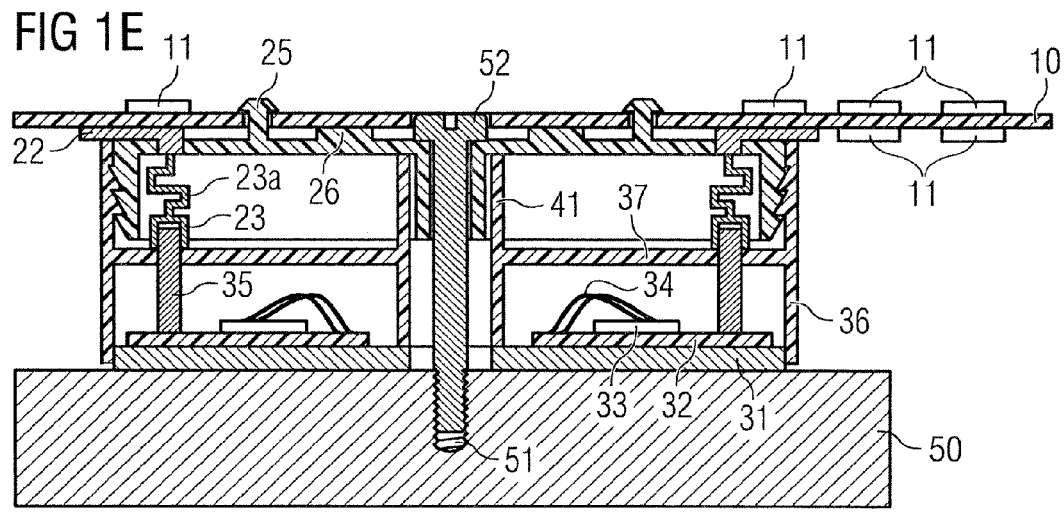

As a result of the mounting adapter 20 being screwed together with the power semiconductor module 30, the lower ends of the contact elements 23 are also pressed against the contact elements 35 of the power semiconductor module 30, with the result that a reliable and permanent electrically conductive connection is present between the terminal locations 22 and the corresponding contact elements 30. FIG. 1E illustrates the power semiconductor module arrangement thus produced.

Figure 2:
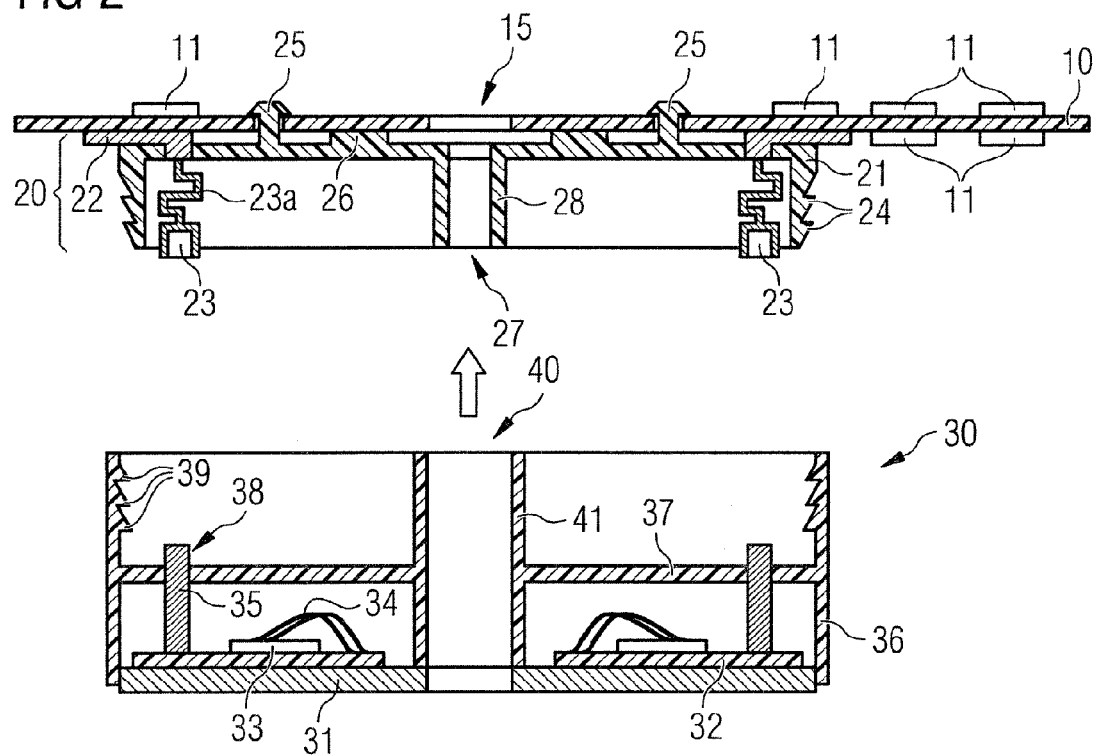
FIG. 2 illustrates one embodiment of the method illustrated in FIG. 1, wherein the mounting adapter is soldered to the circuit carrier without the emplaced power semiconductor module.
Figure 3:
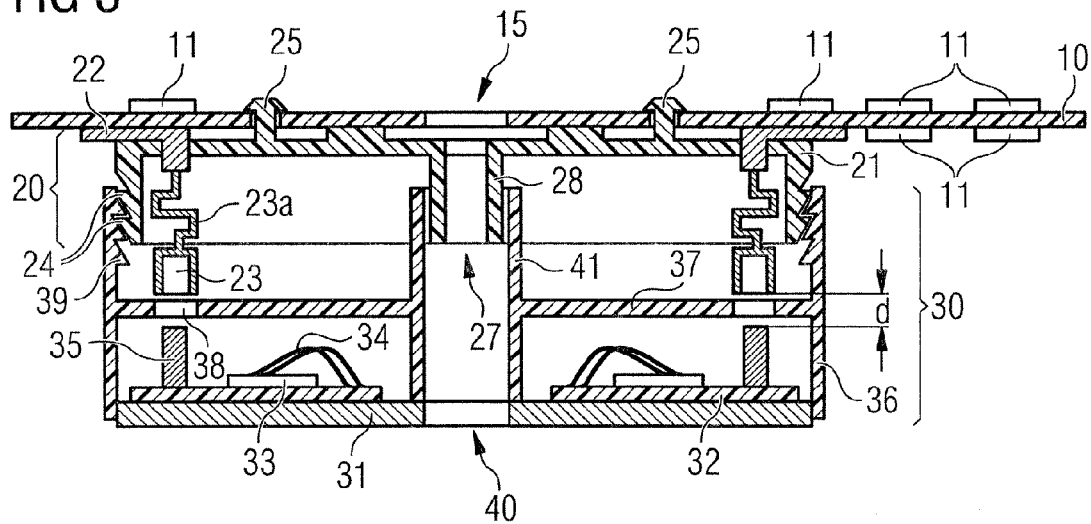
FIG. 3 illustrates one embodiment of a power semiconductor module arrangement wherein the contact elements of the power semiconductor module are arranged below openings in the cover plate of the power semiconductor module.

In a departure from the method explained with reference to FIG. 1, the mounting adapter 20 can also, of course, without the power semiconductor module 30 having been emplaced, be latched and soldered to the circuit carrier 10 in the manner described before the power semiconductor module 30 is placed onto the mounting adapter 20 and latched thereto in the second latching stage. FIG. 2 illustrates the mounting adapter 20 latched and soldered to the circuit carrier 10 with the power semiconductor module 30 not yet having been emplaced.

Various variants with regard to the configuration of the contact elements 23 and 35 of the mounting adapter 20 and of the power semiconductor module 30, respectively, are explained by way of example below with reference to FIGS. 3 to 8. In the arrangement in accordance with FIG. 3, the power semiconductor module 30 has a cover plate 37 having openings 38. The contact elements 35 of the power semiconductor module 30 are in each case arranged between such an opening 38 and a substrate 32. As a result of the latching of the mounting adapter 20 and the power semiconductor module 30, the ends of the contact elements 23 of the mounting adapter 20 project into the corresponding openings 38 in the second latching stage and make contact with the relevant contact elements 35 of the power semiconductor module 30 in the second latching stage. In this case, the geometry can be chosen such that those ends of the contact elements 23 which face the power semiconductor module 30 are laterally guided and stabilized through the openings 38.

Figure 4:
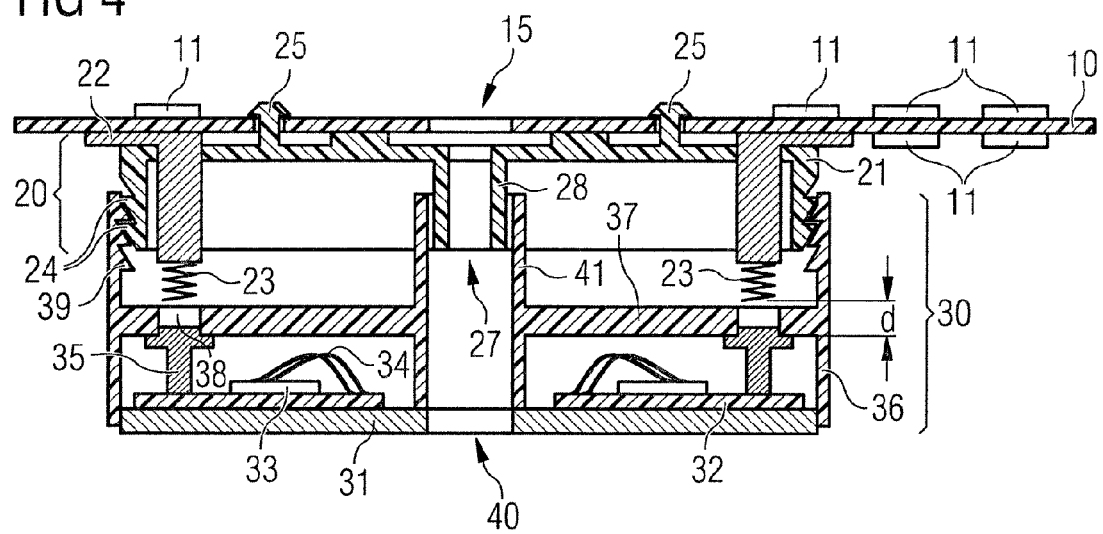
FIG. 4 illustrates one embodiment of a power semiconductor module arrangement wherein the contact elements of the mounting adapter are helical springs.

In the embodiment in FIG. 4, the contact elements 23 of the mounting adapter 20 are embodied as helical springs. The contact elements 35 of the power semiconductor module 30 are arranged below the openings 38 of the cover plate 37, such that when the mounting adapter 20 is latched with the power semiconductor module 30, the helical springs 23 penetrate into the openings 38 into the second latching stage and an electrically conductive contact arises between the helical springs 23 and the corresponding contact elements 35 of the power semiconductor module 30.

Figure 5:
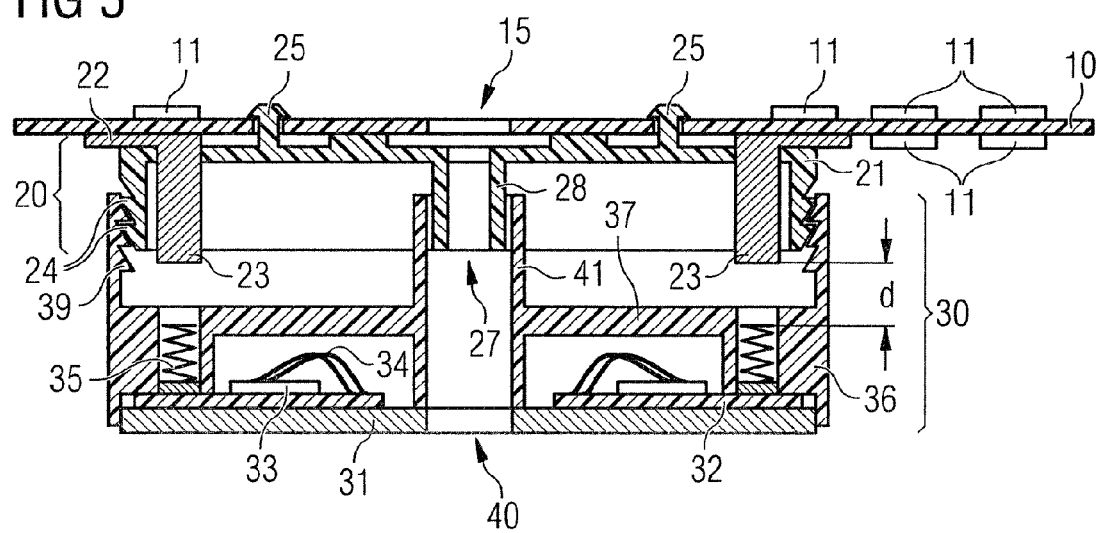
FIG. 5 illustrates one embodiment of a power semiconductor module arrangement wherein the contact elements of the power semiconductor module are helical springs.

In one embodiment, illustrated in FIG. 5, the contact elements 23 of the mounting adapter 20 are embodied in rigid fashion, for example, as metallic straps. The contact elements 35 of the power semiconductor module 30 are formed by spring elements, for example, by helical springs, which are inserted into openings in the housing 36 and at their lower end are electrically conductively connected to corresponding metalizations of the substrates 32. When the power semiconductor module 30 is pushed further onto the mounting adapter 20, the latter latches with the power semiconductor module in the second latching stage, wherein the ends of the contact elements 23 of the mounting adapter 20 penetrate into the corresponding openings in the housing 36 and make electrically conductive contact with the spring elements arranged therein.

Figure 6:
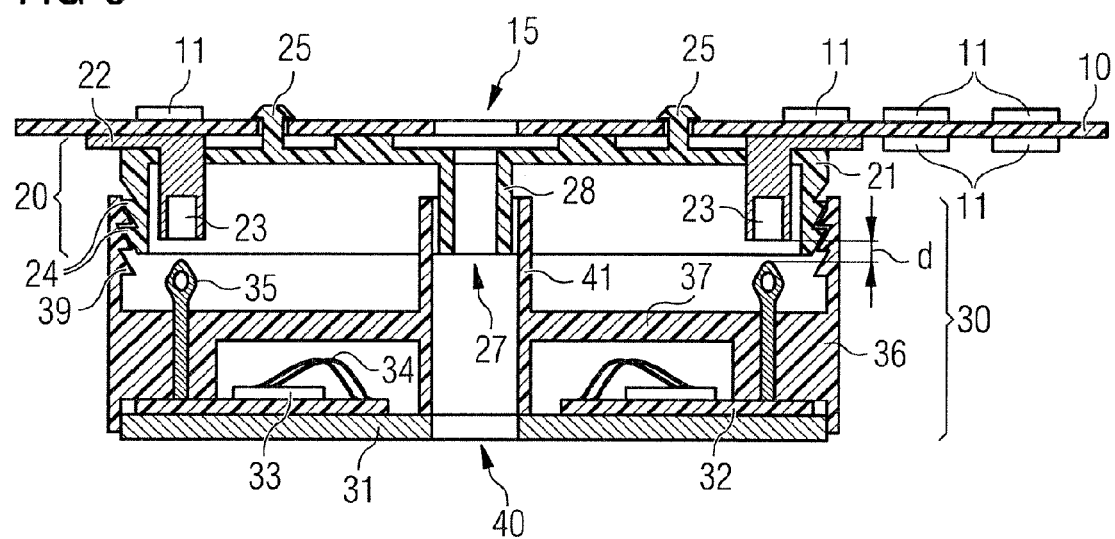
FIG. 6 illustrates one embodiment of a power semiconductor module arrangement wherein the contact elements of the mounting adapter have sleeve-type ends into which the assigned contact elements of the power semiconductor module can be inserted to form press-fit connections.

In the embodiment in FIG. 6, the contact elements 23 of the mounting adapter 20 are provided with sleeve-shaped ends. In a manner corresponding thereto, the contact elements 35 of the power semiconductor module 30 are shaped such that they have an oversize with respect to the internal dimensions of the sleeve-shaped ends of the corresponding contact elements 23 of the mounting adapter 20, whereby a press-fit connection between the ends of corresponding contact elements 23 and 35 forms when the power semiconductor module 30 is pushed further onto the mounting adapter 20. In order to obtain a defined press-fit force, the upper ends of the contact elements 35 of the power semiconductor module 30 can have an opening or a depression that weakens the mechanical strength of the upper end of the contact elements 35 in a targeted manner.

Figure 7:
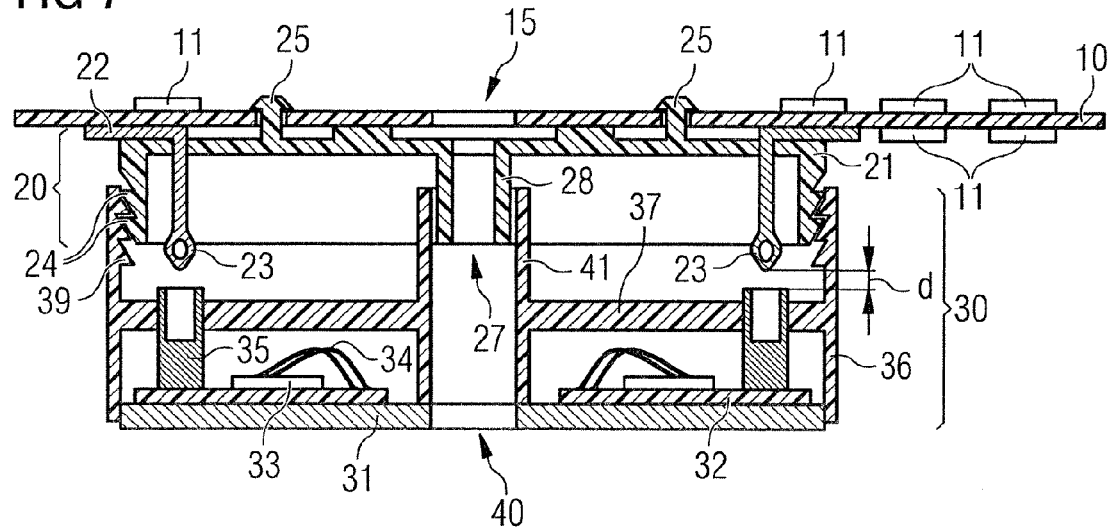
FIG. 7 illustrates one embodiment of a power semiconductor module arrangement wherein the contact elements of the power semiconductor module have sleeve-type ends into which the assigned contact elements of the mounting adapter can be pressed to form press-fit connections.

The embodiment in FIG. 7 corresponds to the embodiment in FIG. 6 with the difference that here the upper ends of the contact elements 35 of the power semiconductor module 30 are embodied as sleeves into which the lower ends of the contact elements 23 of the mounting adapter 20 are press-fitted when the power semiconductor module 30 is pushed further onto the mounting adapter 20 at the latest in the second latching stage and form press-fit connections with them.

Figure 8:
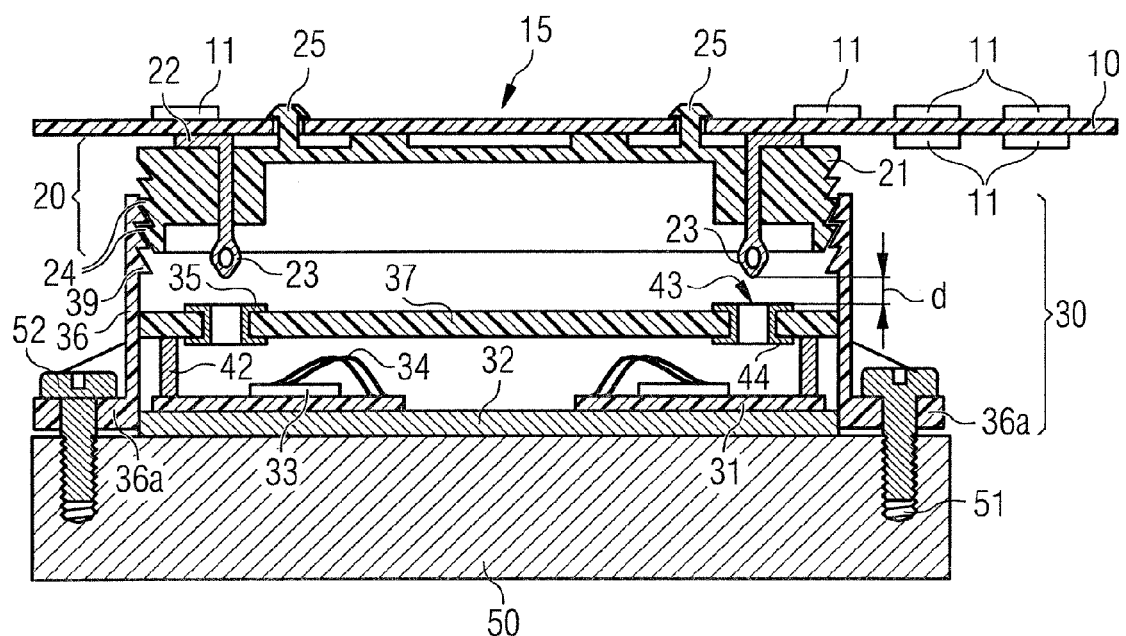
FIG. 8 illustrates one embodiment of a power semiconductor module arrangement wherein the power semiconductor module has a cover plate provided with metalized openings into which the contact elements of the mounting adapter can be pressed to form press-fit connections.

In the embodiment in FIG. 8, the electrically conductive connection between the contact elements 35 of the power semiconductor module 30 and the corresponding contact elements 23 of the mounting adapter 20 is likewise effected by using press-fit connections. For this purpose, the power semiconductor module 30 has a cover plate 37, which can be embodied as a circuit board, for example, as a PCB. The contact elements 35 of the power semiconductor module 30 are provided by "contact holes", i.e. by metalized openings 43, which are connected to the structured metalization of a substrate 22 by using a structured metalization (not illustrated further) of the cover plate 37 and also by using metallic connecting straps 42. If, proceeding from the first latching stage as illustrated in FIG. 8, in which stage there is no electrical contact between the contact elements 35 of the power semiconductor module 30 and the corresponding contact elements 20 of the mounting adapter 20, the power semiconductor module 30 is pushed further onto the mounting frame 20, then the lower ends of the contact elements 23 of the mounting adapter 20 are press-fitted into the metalized openings 35 of the cover plate 37 in a second latching stage and thus make contact with the metalization 44 of the contact holes 43.

In a departure from a central fixing opening, mounting flanges 36a are integrally formed onto the housing 36, the mounting flanges having fixing holes by using which the power semiconductor module 30 can be screwed to a heat sink 50.

Figure 9:
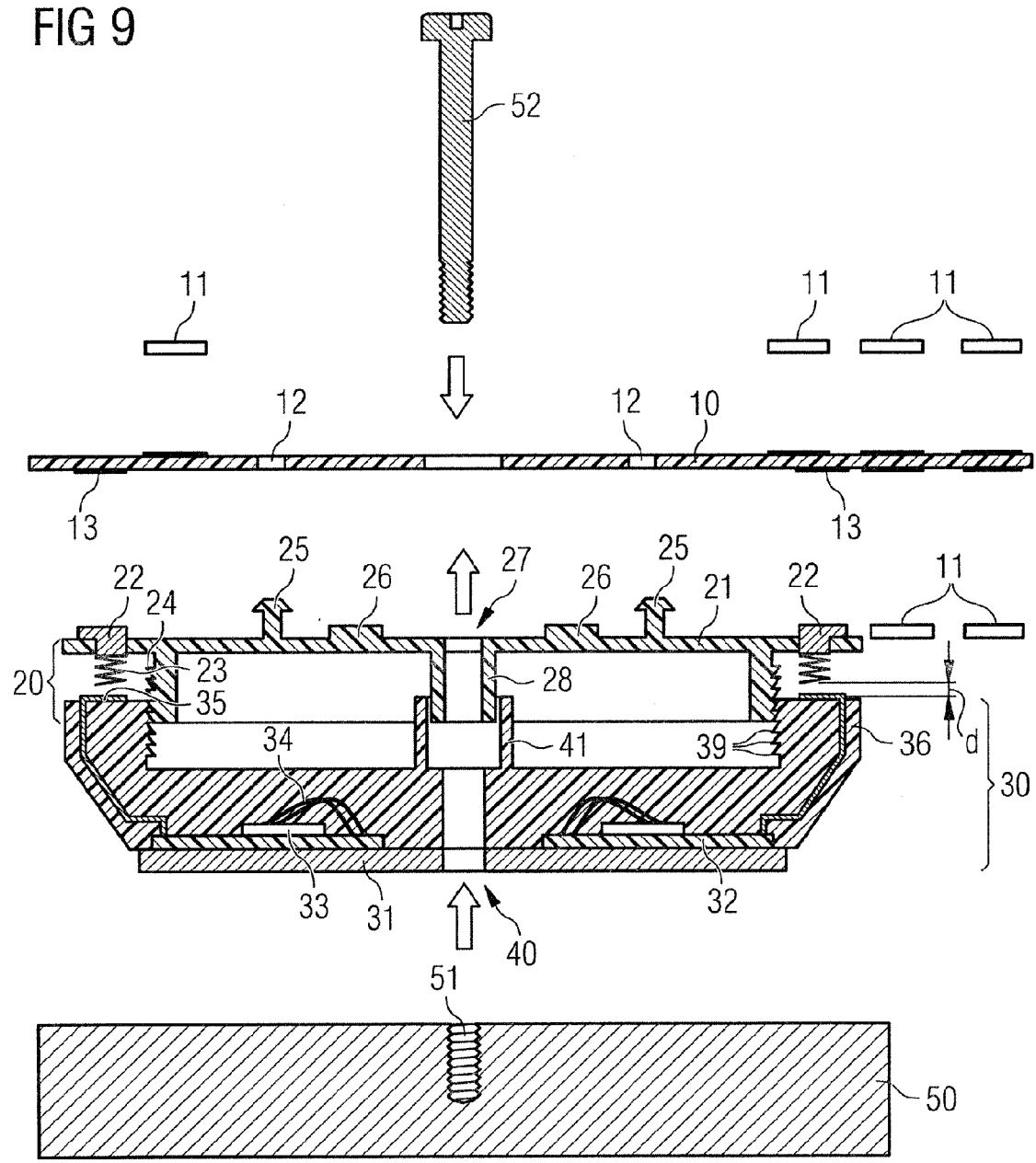
FIG. 9 illustrates a method for producing a power semiconductor module arrangement wherein the power semiconductor module has a cast housing, wherein firstly the mounting adapter, wherein the power semiconductor module is latched to the mounting adapter in a first latching stage prior to the soldering operation without the formation of contacts between the contact elements of the power semiconductor module and the assigned contact elements of the mounting adapter occurring in the process.

FIG. 9 illustrates one embodiment with a power semiconductor module system including a power semiconductor module 30 and a mounting adapter 20. In a departure from the power semiconductor modules explained above, the power semiconductor module 30 in accordance with FIG. 9 has a cast housing. The contact elements 35 of the power semiconductor module 30 are embodied as stamped and bent sheet-metal straps and at one end are electrically conductively connected to a metalization of a substrate 32. The other end of the contact element 35 is led out from the housing 36 and bent over on the side opposite the baseplate 31, such that a plane contact area running parallel to the underside of the baseplate 31 arises.

In the same way as the power semiconductor modules explained with reference to the previous figures, the power semiconductor module 30 in accordance with FIG. 9 also has at least one power semiconductor chip 33 which is arranged on a metalized ceramic substrate 32 and electrically connected by using this metalization and also by using bonding wires 34. The ceramic substrate 32 equipped with the power semiconductor chip 33 is likewise arranged on the metallic baseplate 31.

The substrates 32, the semiconductor chips 33, the bonding wires 34 and also the contact elements 35 are embedded into the casting compound forming the housing 36 and are mechanically stabilized and electrically insulated by the casting compound. A central mounting opening 40 is provided at the module for mounting purposes. On the opposite side with respect to the baseplate 31, the housing 36 has a supporting element 41, which, by way of example, can be embodied in cylindrical-ring-shaped fashion and be arranged around the axis of the mounting opening 40. The supporting element 41 serves, during a later process of screwing together the module, to take up the forces arising during a screwing-together process and thereby to prevent or at least reduce a flexure of the module 30. The housing 36 furthermore has, on an opposite side with respect to the baseplate 31, flanks provided with one or more latching elements 39 on their side facing the mounting opening 40 or the supporting element 41. In the present embodiment according to FIG. 9, the latching elements 39 are embodied as latching lugs.

A mounting adapter 20 is provided for the mounting of the power semiconductor module 30, the mounting adapter likewise having a central mounting opening 27. The mounting adapter 20 includes a dielectric body 21 having a central fixing opening 27. The central fixing opening 27 is formed by a supporting element 28, which serves to absorb screwing-together forces during a later process of screwing together the mounting adapter 20 with the power semiconductor module 30 and to avoid an excessive flexure of the mounting adapter 20. The body 21 furthermore has lateral flanks provided with one or more latching elements 24 on their side remote from the central fixing opening 27 or on their side remote from the supporting element 28. The latching elements 24 are arranged such that they can latch with the latching elements 39 of the power semiconductor module 30 during a process of screwing together the power semiconductor module 30 with the mounting adapter 20.

In order to produce an electrically conductive connection of the mounting adapter 20 to a circuit carrier 10, the mounting adapter 20 has terminal locations 22 embodied as SMD contacts. The terminal locations 22 are electrically conductively connected to resilient contact elements 23 embodied as helical springs, by way of example. The latching elements 39 of the power semiconductor module 30 and the latching elements 24 of the mounting adapter 20 are arranged in such a way that the power semiconductor module 30 and the mounting adapter 20 can be latched with one another in such a way that the contact elements 35 of the power semiconductor module 30 do not yet make contact with the corresponding contact elements 23 of the mounting adapter 20 in a first latching stage as illustrated in FIG. 9, but rather have a spacing d.

When the power semiconductor module 30 is pushed further onto the mounting adapter 20, then a second latching stage is reached, in which the contact elements 35 of the power semiconductor module 30 make contact with the corresponding contact elements 23 of the mounting adapter 20, such that electrically conductive connections arise between the terminal locations 22 and the corresponding contact elements 35. The unit including the mounting adapter 20 and the power semiconductor module 30 latched thereto in the first latching stage can likewise, together with optional conventional electronic components 11, be soldered to a circuit carrier 10 and be screwed to a heat sink 50, as was explained with reference to FIG. 1.

Figure 10:
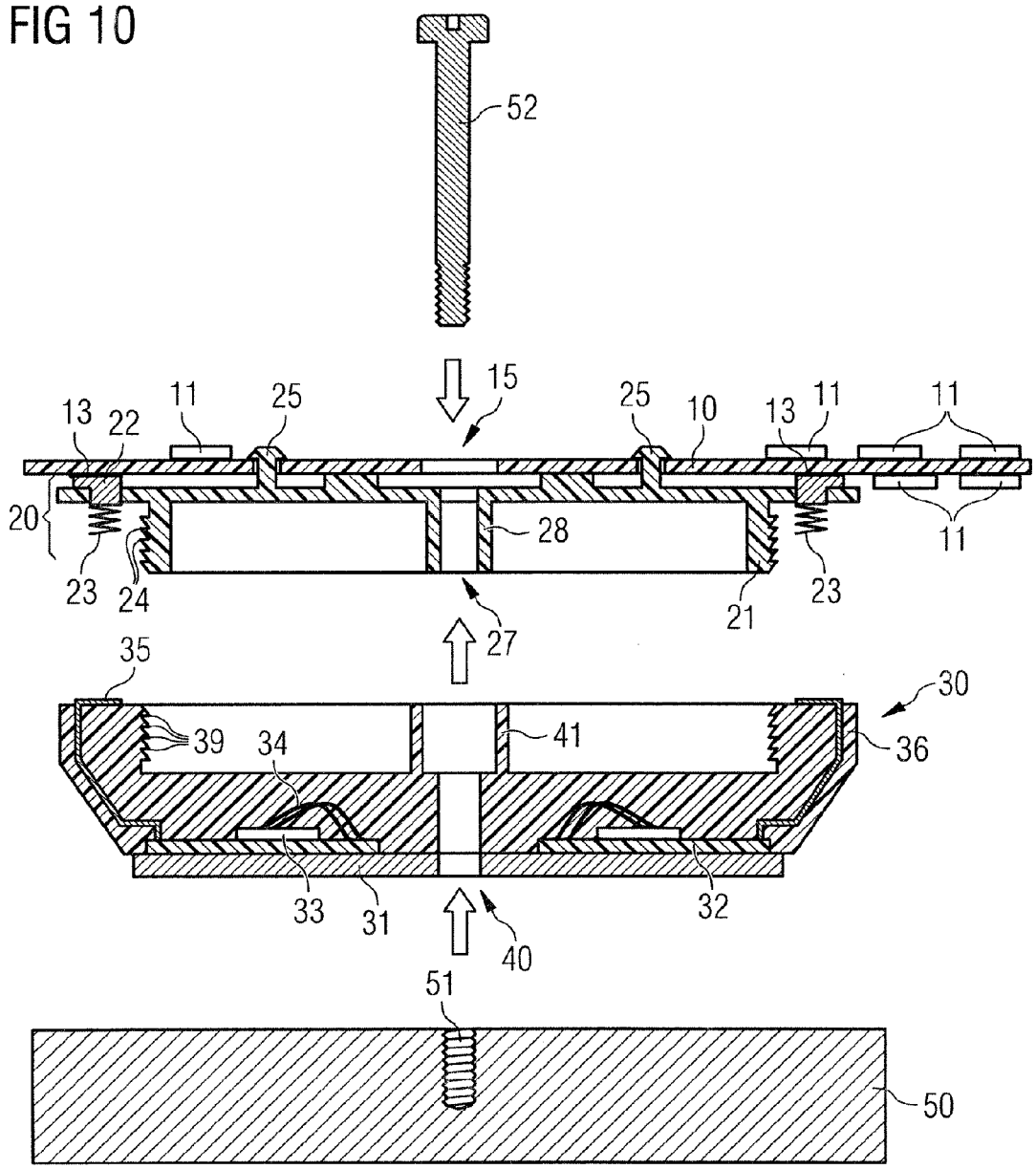
FIG. 10 illustrates one embodiment of a method, wherein the mounting adapter, in a manner corresponding to the method in accordance with FIG. 2, is soldered to the circuit carrier without the emplaced power semiconductor module and the power semiconductor module is subsequently emplaced onto the mounting adapter.

In a departure from the method explained with reference to FIG. 9, the mounting adapter 20 can also, of course, without the power semiconductor module 30 having been emplaced, be latched and soldered to the circuit carrier 10 in the manner described before the power semiconductor module 30 is placed onto the mounting adapter 20 and latched thereto in the second latching stage. FIG. 10 illustrates the mounting adapter 20 latched and soldered to the circuit carrier 10 with the power semiconductor module 30 not yet having been emplaced and the heat sink 50 not yet having been screwed on.

The following FIGS. 11A to 12B illustrate in each case a plan view and also a view from below both for the mounting adapter 20 and for the power semiconductor module 30. A sectional plane E that represents the view of the relevant component in accordance with FIG. 10 is depicted in each case.

Figure 11A:
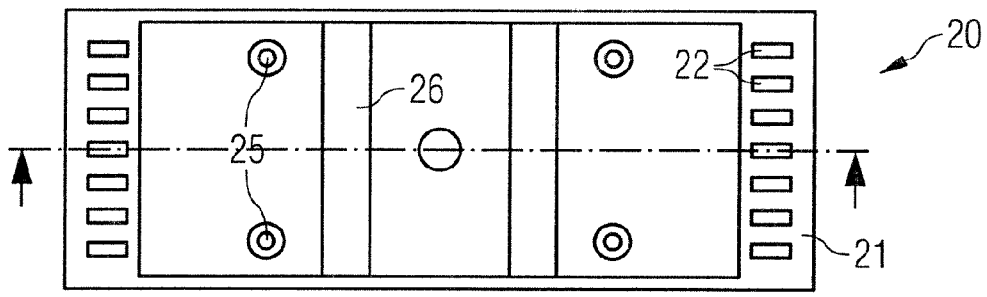
FIG. 11A illustrates one embodiment of a top side of the mounting adapter illustrated in FIGS. 9 and 10.
Figure 11B:
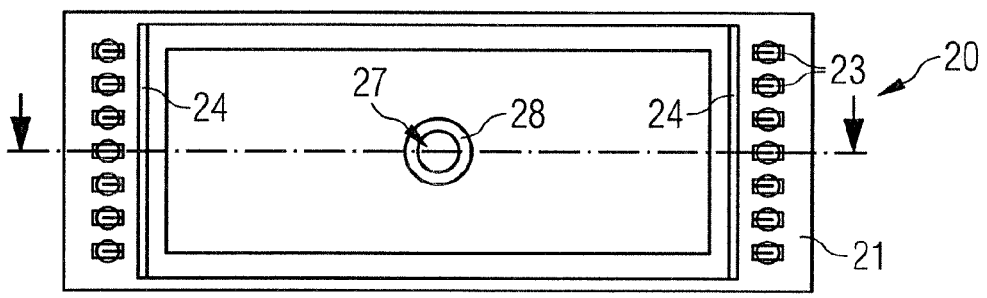
FIG. 11B illustrates one embodiment of an underside of the mounting adapter illustrated in FIGS. 9 and 10.

FIG. 11A illustrates the top side of the mounting adapter 20 explained with reference to FIGS. 9 and 10. This view reveals that in each case a plurality of terminal elements 22 can be arranged at a distance from one another in mutually opposite rows. FIG. 11B illustrates that side of the mounting adapter 20 in accordance with FIGS. 9 and 10 which faces the power semiconductor module 30. It reveals that the contact elements 23, in a manner corresponding to the terminal elements 22, can be arranged at a distance from one another and in parallel rows. It can likewise be discerned that the lateral flanks of the mounting adapter 20 can form a frame which is closed in ring-shaped fashion and at which the latching elements 24 are arranged on mutually opposite sides.

Figure 12A:
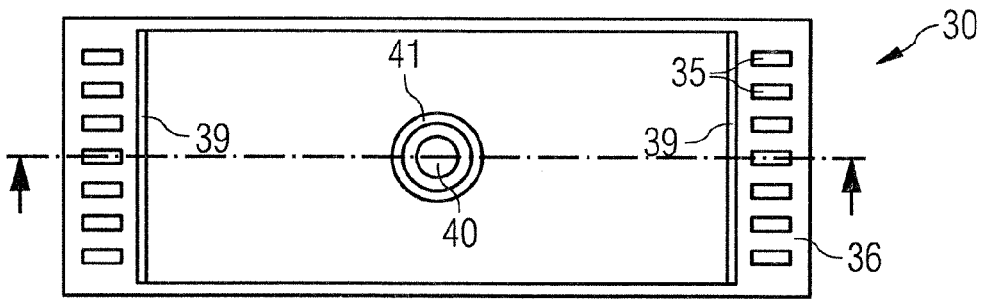
FIG. 12A illustrates one embodiment of a top side of the power semiconductor module illustrated in FIGS. 9 and 10.
Figure 12B:
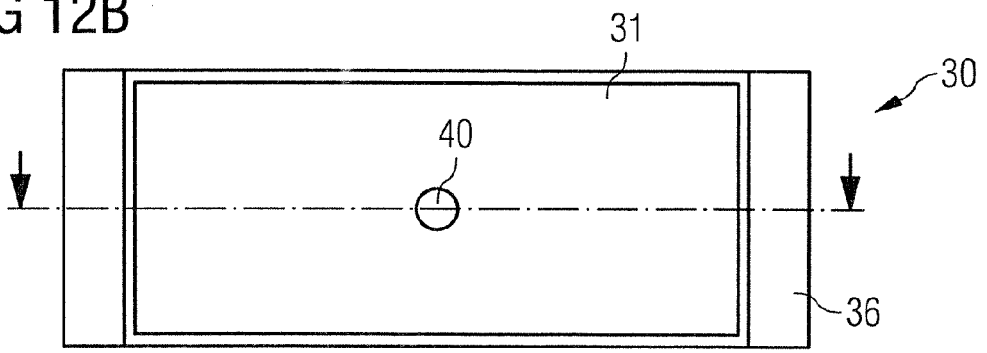
FIG. 12B illustrates one embodiment of an underside of the power semiconductor module illustrated in FIGS. 9 and 10.

FIG. 12A illustrates a view of the top side—opposite to the baseplate—of the power semiconductor module 30 according to FIGS. 9 and 10. In one embodiment, those ends of the contact elements 35 which project from the housing 36 and run parallel to the baseplate (not visible in this view) can be discerned. The lateral flanks of the housing 36 form a circumferential frame into which the lateral flanks of the mounting adapter 20 in accordance with FIG. 11B can be inserted, such that the latching elements 24 thereof latch with the latching elements 39 of the power semiconductor module 30. FIG. 12B illustrates the underside of the module with a view of the baseplate 31.

It can be seen from FIGS. 11B, 12A and 12B that it can be sufficient to provide, for screwing together the power semiconductor module 30 and the mounting adapter 20, just one central mounting opening of the power semiconductor module for inserting a fixing screw. However, the same applies to any other power semiconductor module too. In principle, two or more mounting openings can also be provided in a corresponding manner, of course, which need not necessarily be arranged in the center of the module.

In all the previous embodiments, the mounting adapters 20 were provided with latching elements 25 provided for latching the mounting adapter to a circuit carrier 10. For this purpose, however, it is necessary for the circuit carrier 10 to have openings 12 corresponding to the latching elements 25. However, this type of latching takes up space on the circuit carrier 10 which is no longer available for the mounting of other components.

In order to utilize this space, provision can be made for dispensing with such mounting openings 12 and/or other mounting openings or similar openings and for providing only a single opening 15 in the circuit carrier 10 which serves for screwing together the mounting adapter 20 soldered to the circuit carrier 10 with the power semiconductor module 30 and with a heat sink 50. In the event of dispensing with latching using latching elements 25 and latching openings 12, it is possible for the mechanical connection of the mounting adapter 20 to the circuit carrier 10 to be effected solely by the soldering of the terminal locations 22 of the mounting adapter 20 to the corresponding terminal locations 13 of the circuit carrier 10.

In all the previous embodiments, the terminal locations 22 of the mounting adapter 20 were embodied as SMD terminal pads. In a departure therefrom, there is, of course, also the possibility, in principle, of embodying the terminal locations 22 as solderable pins, as is illustrated in the arrangement in accordance with FIG. 13. In a manner corresponding to the pins 22, terminal locations 13 embodied as contact holes are arranged in the circuit carrier 10. The pins 22 are inserted into the corresponding contact holes 13 and soldered thereto by using a solder 14.

In all the previous embodiments, the latching of the power semiconductor module 30 to the mounting adapter 20 was explained on the basis of two different latching stages with one another. In this case, in a first latching stage there was still no contact between the contact elements 35 of the power semiconductor module and the corresponding contact elements 23 of the mounting adapter 20. When the power semiconductor module 30 was pushed further onto the mounting adapter 20, a second latching stage was reached, in which the contact elements 35 of the power semiconductor module 30 made contact with the corresponding contact elements 23 of the mounting adapter 20, resulting in a reliable electrical connection between the respective contact partners 23 and 35.

In order to realize these at least two latching stages it is necessary for at least one of the latching partners which are formed by the power semiconductor module 30 and the mounting adapter 20 that are to be latched to one another to have at least two latching elements which can both be latched to a specific, corresponding latching element of the other latching partner. Consequently, the other latching partner must have at least one latching element corresponding to the at least two latching elements of this latching partner, which is explained on the basis of various embodiments of latching element pairs with corresponding latching elements 24, 36 with reference to the subsequent FIGS. 13 to 17. FIGS. 13 to 17 each illustrate a flank of the body 21 of the mounting adapter 20 and a flank of the housing 36 of the power semiconductor module 30.

In the embodiment in accordance with FIG. 14, the flank of the body 21 has two latching elements 24 embodied as latching lugs, and the flank of the housing 36 has three latching elements 39 likewise embodied as latching lugs. FIG. 14A illustrates the flanks in the unlatched state, FIG. 14B illustrates them in the first latching stage, and FIG. 14C illustrates them in the second latching stage.

In a departure from this it is in principle also sufficient, however, if one of the latching partners 21, 36 has only one latching element. In FIG. 15, the flank of the body 21 is provided only with one latching lug 24. FIG. 15a illustrates the unlatched state, FIG. 15B illustrates the first latching stage, FIG. 15C illustrates the second latching stage and FIG. 15D illustrates a third latching stage. Whereas there is still no contact between the contact elements 35 of the power semiconductor module 30 and the corresponding contact elements 23 of the mounting adapter 20 in the latching stages in accordance with FIGS. 15A and 15B, the contact elements 35 make contact with the corresponding contact elements 23 in the case of a latching in the second and third latching stages illustrated with reference to FIGS. 15C and 15D respectively.

Figure 16A:
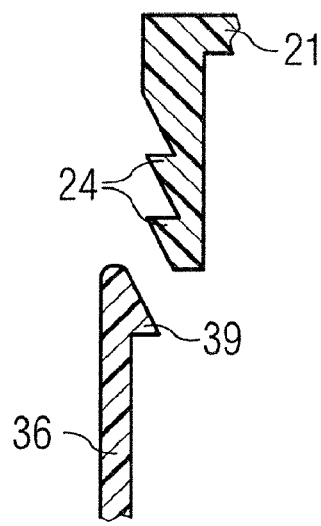
FIG. 16 illustrates various latching stages of a latching of latching elements of a mounting adapter to latching elements of a power semiconductor module, wherein the latching elements of the power semiconductor module are embodied as single latching lugs and the corresponding latching elements of the mounting adapter are embodied as multiple latching lugs.
Figure 16B:
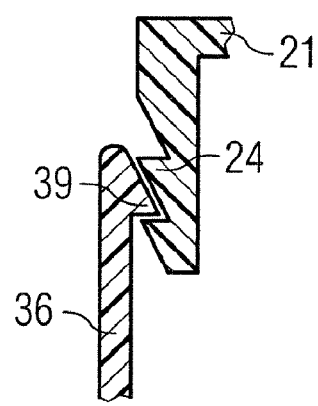
Figure 16C:
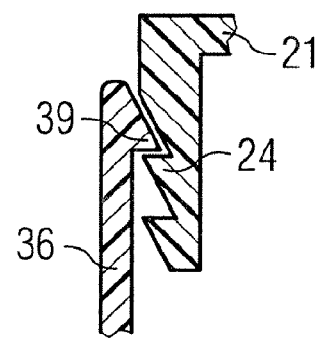

In the embodiment in FIG. 16, a flank of the body 21 has two latching lugs 24, whereas only one corresponding latching lug 39 of the side flank of the housing 36 of the power semiconductor module is provided with respect to the two latching lugs 24. FIG. 16a illustrates the unlatched state, FIG. 16B illustrates the first latching stage and FIG. 16C illustrates the second latching stage.

Figure 17A:
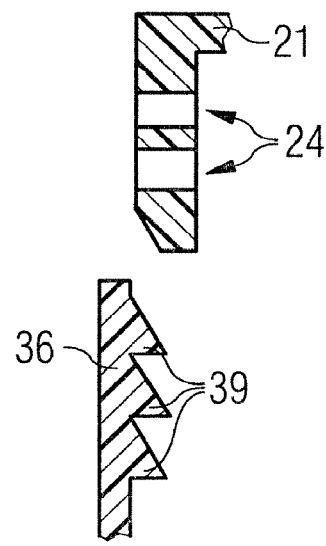
FIG. 17 illustrates various latching stages of a latching of latching elements of a mounting adapter to latching elements of a power semiconductor module, wherein the latching elements of the power semiconductor module are embodied as multiple latching lugs and the latching elements of the mounting adapter are embodied as openings.
Figure 17B:
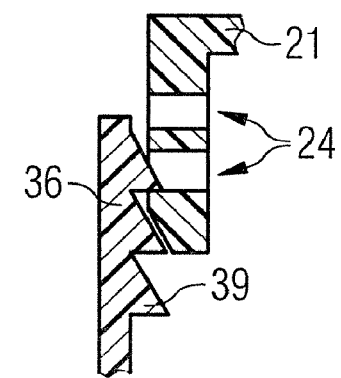
Figure 17C:
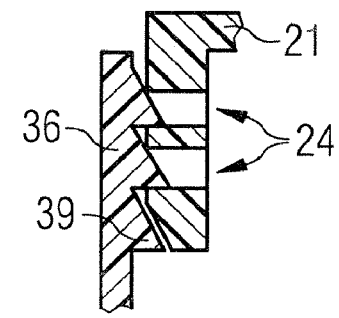

Up to this point the invention has been explained merely on the basis of latching lugs. In principle, however, the latching can also be effected by any other latching elements. All that is crucial in the choice of the type of latching is that the power semiconductor module 30 and the mounting adapter 20 can be latched to one another in two different latching stages, such that an electrical contact between at least one contact element 35 of the power semiconductor module 30 and a contact element 23 of the mounting adapter 20 is effected only in a second, but not in a first latching stage. FIG. 17 illustrates one embodiment which is based on the embodiment in accordance with FIG. 14 and in which, in a departure therefrom, the latching elements 24 arranged on the flank of the body 21 are not embodied as latching lugs but rather as openings. The latching lugs 39 of the power semiconductor module 30 can latch with the openings 24 of the mounting adapter 30 in a plurality of latching stages.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module system comprising:
   a mounting adaptor for producing electrically conductive connections between a circuit carrier and a power semiconductor module, the mounting adapter comprising electrically conductive contact elements for the electrical contact-connection of a power semiconductor module, wherein each of the contact elements is electrically conductively connected to a solderable terminal location of the mounting adapter; and
   a power semiconductor module comprising electrically conductive contact elements configured to be electrically contact-connected to an assigned contact element of the mounting adaptor;
   wherein the mounting adapter and the power semiconductor module can be latched to one another in two different latching stages such that at least one of the contact elements of the power semiconductor module makes electrical contact with that contact element of the mounting adapter which is assigned to the contact element in a second one of the latching stages but not in a first one of the latching stages.

2. The power semiconductor module system of claim 1, wherein the mounting adapter comprises a first latching element and a second latching element; the power semiconductor module comprises a latching element; the latching element of the power semiconductor module can be latched to each of the two latching elements of the mounting adapter in order to produce the two different latching stages.

3. The power semiconductor module system of claim 1, wherein the mounting adapter comprises a latching element; the power semiconductor module comprises a first latching element and a second latching element; wherein the latching element of the mounting adapter can be latched to each of the two latching elements of the power semiconductor module in order to produce the two different latching stages.

4. The power semiconductor module system of claim 2, comprising wherein at least one latching element of the mounting adapter is embodied as a latching lug or as an opening.

5. The power semiconductor module system as claimed in claim 2, comprising wherein at least one latching element of the power semiconductor module is a latching lug or an opening.

6. The power semiconductor module system of claim 1, comprising wherein the mounting adapter and the power semiconductor module can be latched to one another in a positively locking manner in at least one of the different latching stages.

7. The power semiconductor module system of claim 1, comprising wherein an electrically conductive contact-connection or connection between at least one of the contact elements of the power semiconductor module and the assigned contact element of the mounting adapter is produced by using a plug connection.

8. The power semiconductor module system as claimed in claim 7, comprising wherein the plug connection is a press-fit connection.

9. The power semiconductor module system of claim 7, comprising wherein the at least one of the contact elements of the power semiconductor module and the assigned contact element of the mounting adapter are substance-to-substance bonded to one another.

10. The power semiconductor module system of claim 1, comprising wherein at least one of the contact elements of the power semiconductor module is configured as a spring element.

11. The power semiconductor module system of claim 1, comprising wherein at least one of the contact elements of the mounting adapter is configured as a spring element.

12. The power semiconductor module system of claim 1, with a circuit carrier comprising a number of terminal locations, wherein each of the terminal locations of the mounting adapter is soldered to an assigned terminal location of the circuit carrier.

13. The power semiconductor module system of claim 12, comprising wherein the circuit carrier has no opening.

14. The power semiconductor module system of claim 12, wherein the circuit carrier comprises, as single opening, a central fixing opening aligned with a corresponding fixing opening of the power semiconductor module.

15. A power semiconductor module arrangement comprising
a power semiconductor module system with a mounting adaptor for producing electrically conductive connections between a circuit carrier and a power semiconductor module, the mounting adapter comprising electrically conductive contact elements for the electrical contact-connection of a power semiconductor module, wherein each of the contact elements is electrically conductively connected to a solderable terminal location of the mounting adapter;
a power semiconductor module comprising electrically conductive contact elements configured to be electrically contact-connected to an assigned contact element of the mounting adaptor;
wherein the mounting adapter and the power semiconductor module are configured to be latched to one another in two different latching stages such that at least one of the contact elements of the power semiconductor module makes electrical contact with that contact element of the mounting adapter assigned to the contact element in a second one of the latching stages but not in a first one of the latching stages; and
a circuit carrier comprising a conductor track structure with electrical terminal locations, wherein each of the terminal locations of the mounting adapter is soldered to an assigned terminal location of the circuit carrier.

16. The power semiconductor module arrangement of claim 15, comprising wherein at least one of the terminal locations of the mounting adapter is formed as a planar SMD contact.

17. The power semiconductor module arrangement of claim 16, comprising wherein the planar SMD contact is soldered to a terminal location of the mounting adapter which terminal location being formed as a planar section of a conductor track structure.

18. The power semiconductor module arrangement of claim 15, comprising wherein at least one of the terminal locations of the mounting adapter is a terminal pin.

19. The power semiconductor module arrangement of claim 18, comprising wherein the planar terminal pin is inserted into a terminal location of the circuit carrier which is a contact hole, and is soldered to the contact hole.

20. The power semiconductor module arrangement of claim 15, comprising wherein the power semiconductor module and the mounting adapter are latched to one another in the first latching stage.

21. The power semiconductor module arrangement of claim 15, comprising wherein the power semiconductor module and the mounting adapter are latched to one another in the second latching stage.

22. A power semiconductor module system comprising:
a mounting adaptor configured for producing electrically conductive connections between a circuit carrier and a power semiconductor module, the mounting adapter comprising electrically conductive contact elements for the electrical contact-connection of a power semiconductor module;
wherein the mounting adapter and the power semiconductor module are configured to be latched to one another in two different latching stages such that at least one contact element of the power semiconductor module makes electrical contact with at least one of the contact element of the mounting adapter in a second one of the latching stages but not in a first one of the latching stages.

23. A method for producing the power semiconductor module system of claim 22, the method comprising:
providing a circuit carrier comprising a conductor track structure with electrical terminal locations;
providing a power semiconductor module system with a mounting adaptor for producing electrically conductive connections between a circuit carrier and a power semiconductor module, the mounting adapter comprising electrically conductive contact elements for the electrical contact-connection of a power semiconductor module, wherein each of the contact elements is electrically conductively connected to a solderable terminal location of the mounting adapter;
a power semiconductor module comprising electrically conductive contact elements which can in each case be electrically contact-connected to an assigned contact element of the mounting adaptor;
wherein the mounting adapter and the power semiconductor module can be latched to one another in two different latching stages such that at least one of the contact elements of the power semiconductor module makes electrical contact with that contact element of the mounting adapter assigned to the contact element in a second one of the latching stages but not in a first one of the latching stages;
wherein at least one of the contact elements of the power semiconductor module has no electrical contact with that contact element of the mounting adapter assigned to the contact element;

soldering the terminal locations of the mounting adapter to terminal locations of the circuit carrier; and producing an electrical contact between the at least one contact element of the power semiconductor module and that contact element of the mounting adapter assigned to the contact element after soldering.

24. The method of claim 23, comprising carrying out soldering in a state separating the power semiconductor module and the mounting adapter from one another.

25. The method of claim 23, comprising carrying out soldering in a state latching the power semiconductor module and the mounting adapter to one another in the first latching stage; and latching the power semiconductor module and the mounting adapter to one another in the second latching stage after soldering.

* * * * *